(12) United States Patent
Heiss et al.

(10) Patent No.: US 11,444,217 B2
(45) Date of Patent: Sep. 13, 2022

(54) METHOD FOR PRODUCING A THIN-FILM SOLAR MODULE

(71) Applicant: CNBM RESEARCH INSTITUTE FOR ADVANCED GLASS MATERIALS GROUP CO., LTD., Bengbu (CN)

(72) Inventors: Andreas Heiss, Penzing (DE); Helmut Vogt, Munich (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 0 days.

(21) Appl. No.: 16/969,538

(22) PCT Filed: Feb. 8, 2019

(86) PCT No.: PCT/CN2019/074736
§ 371 (c)(1),
(2) Date: Aug. 12, 2020

(87) PCT Pub. No.: WO2019/158024
PCT Pub. Date: Aug. 22, 2019

(65) Prior Publication Data
US 2021/0005764 A1  Jan. 7, 2021

(30) Foreign Application Priority Data
Feb. 15, 2018 (EP) ..................................... 18156872

(51) Int. Cl.
*H01L 31/05* (2014.01)
*H01L 31/0463* (2014.01)
(Continued)

(52) U.S. Cl.
CPC .... *H01L 31/0463* (2014.12); *H01L 21/76894* (2013.01); *H01L 31/035281* (2013.01);
(Continued)

(58) Field of Classification Search
CPC ............ H01L 25/042; H01L 31/02008; H01L 31/02021; H01L 31/0463; H01L 31/0465;
(Continued)

(56) References Cited

U.S. PATENT DOCUMENTS

2010/0147384 A1  6/2010  Lerchenberger et al.
2011/0259403 A1*  10/2011  Myong ............... H01L 31/0201
                                                 136/249
(Continued)

FOREIGN PATENT DOCUMENTS

CN  105684160 A  6/2016
CN  105990467 A  10/2016
(Continued)

OTHER PUBLICATIONS

International Search Report for International App. No. PCT/CN2019/074736 filed on Feb. 8, 2019, on behalf of (CNBM) Bengbu Design & Research Institute for Glass Industry Co., Ltd. dated Apr. 2, 2019. 3 Pages.

(Continued)

*Primary Examiner* — Jae Lee
(74) *Attorney, Agent, or Firm* — Bayramoglu Law Offices LLC (57) ABSTRACT

A method for producing a thin-film solar module with serially connected solar cells and related device. A back electrode layer is deposited on one side of a flat substrate and subdivided by first patterning trenches. An absorber layer is deposited over the back electrode layer and subdivided by second patterning trenches. A front electrode layer is deposited over the absorber layer. At least the front electrode layer (Continued)

is subdivided by third patterning trenches. A direct succession of a first patterning trench, a second patterning trench, and two adjacent third patterning trenches forms a patterning zone. The third patterning trenches are produced by laser ablation through a pulsed laser beam, where one third patterning trench is produced with laser pulses of higher energy and the other third patterning trench of the patterning zone is produced with laser pulses of lower energy.

16 Claims, 5 Drawing Sheets

(51) Int. Cl.
    *H01L 31/0352*      (2006.01)
    *H01L 21/768*      (2006.01)
    *H01L 31/0216*      (2014.01)
    *H01L 31/0224*      (2006.01)
    *H01L 31/032*      (2006.01)

(52) U.S. Cl.
    CPC .............................. *H01L 31/02167* (2013.01); *H01L 31/022483* (2013.01); *H01L 31/0323* (2013.01)

(58) Field of Classification Search
    CPC .. H01L 31/05; H01L 31/0504; H01L 31/0508
    See application file for complete search history.

(56) References Cited

U.S. PATENT DOCUMENTS

| | | |
|---|---|---|
| 2013/0025645 A1 | 1/2013 | Zhou et al. |
| 2014/0352767 A1 | 12/2014 | Lee |
| 2015/0068580 A1 | 3/2015 | Probst |
| 2015/0228820 A1* | 8/2015 | Chen .................... H01L 31/0465 136/256 |
| 2016/0268454 A1 | 9/2016 | Gwon |
| 2017/0373208 A1* | 12/2017 | Bosman .......... H01L 31/022433 |

FOREIGN PATENT DOCUMENTS

| | | |
|---|---|---|
| DE | 4324318 C1 | 1/1995 |
| EP | 2200097 A1 | 6/2010 |

OTHER PUBLICATIONS

Written Opinion for International App. No. PCT/CN2019/074736 filed on Feb. 8, 2019, on behalf of (CNBM) Bengbu Design & Research Institute for Glass Industry Co., Ltd. dated Apr. 2, 2019. 3 Pages.

* cited by examiner

METHOD FOR PRODUCING A THIN-FILM SOLAR MODULE

CROSS-REFERENCE TO RELATED APPLICATIONS

The present application is the U.S. National Stage of International Patent Application No. PCT/CN2019/074736 filed on Feb. 8, 2019 which, in turn, claims priority to European Patent Application No. EP 18156872.6 filed on Feb. 15, 2018.

The present invention is in the technical area of photovoltaic energy generation and relates to a method for producing a thin-film solar module, wherein at least one patterning zone that has two third patterning trenches is provided. The invention further extends to a thin-film solar module produced by the method according to the invention.

Thin-film solar modules have already been described many times in the patent literature. Reference is made merely by way of example to the printed publications DE 4324318 C1 and EP 2200097 A1. Thin-film solar modules offer the particular advantage that the solar cells can already be serially connected in an integrated form during production of the layers. The various layers are typically applied directly onto a flat carrier substrate and patterned by layer trenches that completely subdivide the layers. The layer structure for forming the solar cells comprises a front electrode layer and a back electrode layer as well as a photovoltaically active absorber layer, wherein, generally speaking, additional layers, such as a buffer layer, are present between the absorber layer and the front electrode layer. After patterning of the solar cells, the coated carrier substrate is provided with a cover layer, yielding a weathering-resistant composite.

In terms of technological handling quality and efficiency, thin-film solar modules with an absorber layer of amorphous, micromorphous, or polycrystalline silicon, cadmium telluride (CdTe), gallium-arsenide (GaAs), or a chalcopyrite compound, in particular copper-indium/gallium-disulfide/diselenide ($CuF(In,Ga)(S,Se)_2$), have proved advantageous. Due to the band gap that is well-adapted to the spectrum of sunlight, particularly high absorption coefficients can be achieved with compounds based on $Cu(In,Ga)(S,Se)_2$.

In the layer structure of thin-film solar modules, for an integrated serial connection of the solar cells, a large number of patterning zones are formed, which have in each case at least three linear patterning trenches, also referred to as "patterning lines". Thus, the back electrode layer is subdivided by first patterning trenches P1 for forming the back electrodes of the solar cells; the absorber layer is subdivided by second patterning trenches P2 for forming the absorbers of the solar cells; and the front electrode layer is subdivided by third patterning trenches P3 for forming the front electrodes of the solar cells. Adjacent solar cells are electrically connected to one another in serial connection via electrically conductive material in the second patterning trenches P2, wherein the front electrode of one solar cell is electrically connected to the rear electrode of the adjacent solar cell. The patterning zones result in each case from a direct succession of a first to a third patterning trench P1-P2-P3.

In industrial series production of thin-film solar modules, the third patterning trenches P3 are, generally speaking, produced mechanically, wherein the front electrode layer and usually also the absorber layer is scraped off the layer structure by a moving needle (needle scribing). For the most part, the comparatively hard back electrode layer remains on the carrier substrate. However, in practice, it has been demonstrated that the scraping off of the layers subjects the needle and its holder to heavy mechanical loads, accompanied by high wear and resulting in frequent downtimes of the production systems due to needle changes. As a consequence, productivity is reduced and production costs of thin-film solar modules are increased.

In contrast, the object of the present invention consists in advantageously improving methods for producing thin-film solar modules known in the prior art such that the productivity of the module production is improved. Also, it should be possible to produce thin-film solar modules economically and efficiently in industrial series production with conventional methods.

These and other objects are accomplished according to the proposal of the invention by a method for producing a thin-film solar module and a thin-film solar module in accordance with the coordinate claims. Advantageous embodiments of the invention are indicated through the features of the dependent claims.

According to the invention, a method is presented for producing a thin-film solar module with a monolithically integrated serial connection of solar cells for photovoltaic energy generation. In keeping with the customary use of the term "thin-film solar module", it refers to modules having a layer structure with a low thickness of, for example, a few microns, which require a carrier substrate for adequate mechanical stability. The carrier substrate can be made, for example, of inorganic glass, plastic, metal, or a metal alloy and can be designed, depending on the respective layer thickness and the specific material properties, as a rigid plate or a flexible film.

The invention refers to the production of a thin-film solar module in substrate configuration, wherein the layer structure for producing the solar cells is applied on a carrier substrate surface facing the light-incident side. The invention equally refers to the production of a thin-film solar in superstrate configuration, wherein the carrier substrate is transparent and the layer structure is applied on a carrier substrate surface facing away from the light-incident side.

In a manner known per se, the layer structure of the thin-film solar according to the invention comprises a back electrode layer, a front electrode layer, and a photovoltaically active absorber layer arranged between the back electrode layer and the front electrode layer.

The front electrode layer is optically transparent since passage of light to the layer structure must be enabled. The optically transparent front electrode layer typically includes or is made of a doped metal oxide (TCO=transparent conductive oxide), for example, n-conductive, in particular aluminum-doped, zinc oxide (AZO).

The photovoltaically active absorber layer preferably includes or is made of a chalcopyrite semiconductor, advantageously a ternary I-III-VI-compound semiconductor from the group copper indium/gallium disulfide/diselenide ($Cu(In,Ga)(S,Se)_2$). In the above formula, indium and gallium each can be present alone or in combination. The same is true for sulfur and selenium, each of which can be present alone or in combination. Particularly suitable as material for the absorber layer is CIS (copper indium diselenide/disulfide or CIGS (copper indium gallium diselenide, copper indium gallium disulfide, copper indium gallium disulfoselenide). The absorber layer typically has doping of a first conductor type (charge carrier type) and the front electrode has doping of the opposite conductor type (charge carrier type). Generally speaking, the absorber layer is p-conductive (p-doped), i.e., has an excess of defect electrons (holes) and the front electrode layer is n-conductive (n-doped), such that free electrons are present in excess.

A buffer layer is typically arranged between the absorber layer and the front electrode layer. This is true in particular for absorber layers based on $Cu(In,Ga)(S,Se)_2$, with which, generally speaking, a buffer layer is required between a p-conductive $Cu(In,Ga)(S,Se)_2$ absorber layer and an n-conductive front electrode. According to current knowledge, the buffer layer enables electronic adaptation between the absorber and the front electrode. Moreover, it offers protection against sputtering damage in a subsequent process step of deposition of the front electrode, for example, by DC magnetron sputtering. By means of the succession of an n-conductive front electrode layer, a buffer layer, and a p-conductive absorber layer, a p-n-heterojunction is formed, in other words, a junction between layers of the opposite conductor type.

In the layer structure of the thin-film solar module according to the invention, integrated serially connected solar cells are formed by patterning zones. Thus, at least the back electrode layer is subdivided by first patterning trenches (P1-lines, abbreviated to P1) into sections completely separated from one another, which sections form the back electrodes of the solar cells. Also, at least the absorber layer is subdivided by second patterning trenches (P2-lines, abbreviated to P2) into sections completely separated from one another, which sections form the absorbers of the solar cells, and at least the front electrode layer is subdivided by third patterning trenches (P3-lines, abbreviated to P3) into sections completely separated from one another, which sections form the front electrodes of the solar cells. Adjacent solar cells are electrically connected to one another in serial connection via electrically conductive material in the second patterning trenches, wherein the front electrode of one solar cell is electrically connected to the back electrode of the adjacent solar cell and, typically, but not mandatorily, makes direct physical contact therewith. The patterning trenches are arranged in the order P1-P2-P3 angeordnet, wherein a patterning zone is formed by a direct succession of a first patterning trench P1, a second patterning trench P2, and—as explained in the following—two directly adjacent third patterning trenches P3, P3'.

In the context of the present invention, the term "patterning trench" refers to a material-filled linear depression (perpendicular to the plane of the flat substrate) of the layer structure, wherein a trench is formed in at least one layer of the layer structure. The patterning trenches serve to form the integrated serially connected solar cells, wherein a patterning trench subdivides at least one layer into two layer sections completely separated from one another. Each patterning trench is filled with material that is different from the material of the respective subdivided layer. Thus, for example, the first patterning trenches P1 are typically filled with material of the absorber layer. This can be done in a simple manner during the deposition of the absorber layer. The second patterning trenches P2 are typically filled with material of the front electrode layer, by which means the serial connection of the solar cells is realized, and the third patterning trenches P3 are, for example, filled with material of a cover layer for covering the layer structure applied on the flat substrate.

Preferably, the patterning zones are in each case linear, in particular rectilinear. Correspondingly, the patterning trenches are linear, in particular in the form of rectilinear patterning lines. In the patterning zones, the patterning trenches are preferably arranged parallel to one another and run, for example, parallel to one edge of a rectangular or square module. In particular, the patterning trenches can in each case extend all the way to the edge of the layer structure. The direction of extension of the patterning trenches can be defined as the module length; the direction perpendicular thereto can be defined as the module width.

In keeping with the customary usage, the term "solar cell" refers to a region of the layer structure that has a front electrode, a photovoltaically active absorber, and a back electrode and is delimited by two patterning zones directly adjacent one another. This applies analogously in the edge region of the module, wherein, instead of a patterning zone, there is a connection section for electrically contacting the serial connection of the solar cells, such that the solar cell is defined by the layer region with a front electrode, an absorber, and a back electrode, which is situated between a patterning zone and the directly adjacent connection section.

According to the present invention, the method for producing a thin-film solar module comprises providing a flat (planar) substrate. A back electrode layer that is completely subdivided by (material-filled) first patterning trenches P1 for forming the back electrodes of the solar cells is deposited on one side of the flat substrate. The back electrode layer can be deposited directly onto a surface of the substrate. Alternatively, at least one additional layer can be arranged between the substrate and the back electrode layer. An absorber layer that is completely subdivided by (material-filled) second patterning trenches P2 for forming the photovoltaically active absorbers of the solar cell is deposited over the back electrode layer. The absorber layer can be deposited directly onto a surface of the back electrode layer. Alternatively, at least one additional layer can be arranged between the back electrode layer and the absorber layer. A front electrode layer that is completely subdivided by (material-filled) third patterning trenches P3, P3' for forming the front electrodes of the solar cell is deposited over the absorber layer. The absorber layer is situated between the front electrode layer and the back electrode layer. The front electrode layer can be deposited directly onto a surface of the absorber layer. Alternatively, at least one additional layer can be arranged between the front electrode layer and the absorber layer. Typically, in the case of absorbers based on a chalcopyrite semiconductor, at least one buffer layer is situated between the absorber layer and the front electrode layer, for which purpose the at least one buffer layer is deposited after depositing the absorber layer and before depositing the front electrode layer.

The patterning of the back electrode layer is typically, but not mandatorily, done before depositing the absorber layer. The patterning of the absorber layer is typically, but not mandatorily, done before depositing the front electrode layer.

It is essential here for two third patterning trenches, referred to here and in the following for easier reference as P3 and P3', to be produced in each patterning zone. The two third patterning trenches P3, P3' of one and the same patterning zone are arranged adjacent one another, in other words, no other patterning trench (and no optically active zone) is situated between the two third patterning trenches P3, P3'. In a first alternative, the two third patterning trenches P3, P3' of the same patterning zone can be directly adjacent one another, in other words, no front electrode layer section is situated between the two third patterning trenches P3, P3'. In a second alternative, the two third patterning trenches P3, P3' of the same patterning zone can be separated from one another by a front electrode layer section. Accordingly, a patterning zone comprises a direct succession of a first patterning trench P1, a second patterning trench P2, and two third patterning trenches P3, P3'.

If the two third patterning trenches P3, P3' of one and the same patterning zone are directly adjacent one another, the one patterning trench P3 is delimited by a single trench wall and the other patterning trench P3'. The trench wall of the patterning trench P3 faces the other patterning trench P3', in other words, is positioned opposite the other patterning trench P3'. Correspondingly, the other patterning trench P3' is delimited by a single trench wall and the other patterning trench P3. The trench wall of the patterning trench P3' faces the other patterning trench P3, in other words, is positioned opposite the other patterning trench P3'. The two trench walls of the two patterning trenches P3 and P3' face one another, in other words, are positioned opposite one another and, together, delimit the two third patterning trenches P3, P3'.

When the two third patterning trenches P3, P3' of one and the same patterning zone are not directly adjacent one another, in other words, when a front electrode layer section is situated between the two third patterning trenches P3, P3', each third patterning trench P3, P3' is delimited by two trench walls positioned opposite one another, wherein the front electrode layer section between the two third patterning trenches P3, P3' forms a trench wall in each case. Thus, one third patterning trench P3 is delimited by a trench wall facing the other patterning trench P3' and a trench wall facing away from the other patterning trench P3', which wall is formed by the front electrode layer section situated between the two third patterning trenches P3, P3'. Correspondingly, the other third patterning trench P3' is delimited by a trench wall facing the other patterning trench P3 and a trench wall facing away from the other patterning trench P3, which wall is formed by the front electrode layer section situated between the two third patterning trenches P3, P3'.

In the method according to the invention, the two third patterning trenches P3, P3' are produced in each case by removal of at least the front electrode layer by laser ablation by a pulsed laser beam. Local removal of at least the front electrode layer (optionally also a part of the absorber layer) occurs through direct irradiation of the transparent front electrode layer from the side of the layer structure, wherein the laser beam passes through the transparent front electrode layer and the laser energy is absorbed by the absorber layer. This vaporizes a part of the absorber layer such that the front electrode layer situated above it bulges from the expanding gas and, for example, lifts off circularly (laser ablation). The two third patterning trenches P3, P3' are produced in each case by a sequence of laser pulses, in other words, by stringing together lifted-off regions of the front electrode layer. Preferably, laser pulses adjacent one another are only partially overlapped, with the energy of the laser pulses selected such that a single laser pulse already results in the lifting off of a region of the front electrode layer. This makes possible precise and also particularly efficient production of the third patterning trenches P3, P3'. The absorber layer is not completely subdivided by the two third patterning trenches P3, P3', in other words, the third patterning trenches P3, P3' extend each case into the absorber layer but not all the way to a substrate-side interface of the absorber layer. The energy of the laser pulses is selected for this purpose such that only a part of the absorber layer vaporizes and a part of the absorber layer below (on the substrate side) the third patterning trenches P3, P3' remains.

It is essential here that the two third patterning trenches P3, P3' of one and the same patterning zone are produced by laser pulses with different energy. One third patterning trench P3' is produced with laser pulses that have greater energy than the laser pulses for producing the other third patterning trench P3 of the same patterning zone. Thus, for each patterning zone, one third patterning trench P3' is produced with laser pulses of greater energy and one third patterning trench P3 is produced with laser pulses of lower energy. Here and in the following, "P3'" refers to the third patterning trench that is produced with laser pulses of greater energy, and "P3" refers to the third patterning trench that is produced with laser pulses of lower energy.

As is known to the person skilled in the art, laser pulses have a spatial energy profile perpendicular to the direction of the beam in which the energy decreases from the beam center outward (Gaussian profile). Vaporization of the material occurs substantially only in a central region of the laser pulse, whereas, in contrast, in an edge region of the laser pulse, the energy of the laser pulse is absorbed by the absorber layer without vaporization. As the inventors have now realized for the first time, this has significant influence on the local electrical properties of the remaining (i.e., non-melted) material of the absorber layer that borders the ablation site. In fact, a transformation of the material of the absorber layer can occur, at least in regions, in an edge region of the ablation site as a result of the laser energy introduced, wherein a material can develop that has significantly greater electrical conductivity than the original material of the absorber layer. For example, ternary material phases of a chalcopyrite compound semiconductor can be converted into binary material phases, which, generally speaking, have higher electrical conductivity than the ternary material phases and, in particular, even have a metallic character. Here and in the following, the edge region of the ablation site, or of the third patterning trench P3' produced with laser pulses of higher energy that results from linking together of ablation sites in which, at least in regions (i.e., at least in zones) a material conversion of the material of the absorber layer occurs, is also referred to as a "conversion region". In particular, the conversion region can consist completely of converted material of the absorber layer.

Particularly disadvantageously, electrical short circuit paths (shunts) between the front electrode layer and the back electrode layer can be created by the higher electrical conductivity in the conversion region. As the inventors were able to demonstrate, the extent of formation of the conversion region depends substantially on the energy of the laser pulses beamed in, with higher energy resulting in greater formation of converted material phases and vice versa.

As the inventors have realized, the disadvantageous effect of a change in the electrical properties of the material of the absorber layer by material conversion, in particular through the production of binary phases in tertiary chalcopyrite compound semiconductors, can be significantly reduced by means of the method according to the invention wherein two third patterning trenches are produced per patterning zone. It is essential here for the laser pulses for producing the two third patterning trenches P3, P3' of one and the same patterning zone to have different energy from one another.

Preferably, the laser pulses of lower energy for producing the third patterning trench P3 are selected such that the production of converted material in the edge region of the third patterning trench P3 due to laser energy is at least largely, in particular, completely, prevented. However, generally speaking, this causes leaving incompletely ablated regions of the front electrode layer, in other words, production of one or a plurality of protrusions of the front electrode layer in the direction of the other patterning trench P3' and possibly into it. The energy of the laser pulses with lower energy is selected such that at least one protrusion of the front electrode layer remains, which extends, starting from the trench wall of the third patterning trench P3 facing the third patterning trench P3', over at least 25% of the width of the third patterning trench P3. However, the at least one protrusion of the front electrode layer does not extend all the way to the trench wall of the third patterning trench P3' of the same patterning zone (directly) opposite the protrusion, in other words, it does not extend all the way to the trench wall of the third patterning trench P3' facing the third patterning trench P3. Preferably, the at least one protrusion of the front electrode layer has a distance from the trench wall of the third patterning trench P3' facing the third patterning trench P3, which corresponds to at least 25% of the width of the third patterning trench P3'.

This measure ensures that the production of a conversion region during production of the third patterning trench P3 is avoided or is produced with regard to the desired effect only very slightly or insignificantly. In addition, an electrical short-circuit of the front electrodes of the two adjacent solar cells is avoided by the at least one protrusion.

For example, the at least one protrusion of the front electrode layer of the third patterning trench P3 extends at least over 50%, in particular at least over 75%, and in particular over at least 100% of the width of the third patterning trench P3. Taking into account the usual tolerances in the production of the third patterning trench P3 by laser ablation, the at least one protrusion of the front electrode layer of the third patterning trench P3, for example, extends precisely over the full width of the third patterning trench P3. It is, however, also possible for the at least one protrusion of the front electrode layer of the third patterning trench P3 to extend into the other patterning trench P3'. During the production of the third patterning trench P3, a plurality of protrusions of the front electrode layer can be produced.

The trench wall of the third patterning trench P3 facing the third patterning trench P3' typically has a certain unevenness, wherein the at least one protrusion of front electrode layer can differ clearly and significantly through the claimed dimensioning rules from the micro-protrusions caused by the unevenness, which have in each case a substantially smaller dimension.

In contrast to this, the laser pulses of greater energy for producing the third patterning trench P3' are preferably selected such that the front electrode layer is substantially completely removed, with the likely production of material converted by laser energy, in other words, the likely production of a conversion region. Here, the energy of the laser pulses with greater energy is advantageously selected such that all remaining protrusions of the front electrode layer extend, starting from the trench wall of the third patterning trench P3' facing the third patterning trench P3, in each case over less than 25% of the width of the third patterning trench P3'. For example, the energy of the laser pulses with greater energy for producing the third patterning trench P3' is selected such that all remaining protrusions of the front electrode layer extend in each case over a maximum of 10%, in particular a maximum of 5%, in particular a maximum of 1%, of the width of the third patterning trench P3'. Typically, the trench wall of the third patterning trench P3' facing the third patterning trench P3 has an unevenness that can present micro-protrusions of the front electrode layer. However, there is no protrusion that extends at least over 25% of the width of the third patterning trench P3'.

In the method according to the invention, an electrically better conductive conversion region is indeed produced during the production of the third patterning trench P3'; however, this conversion region has a relatively low shunt effect, in combination with the other third patterning trench P3, wherein the converted material phases are produced only slightly or not at all. Thus, an electrical short-circuit path can in any case appear via incompletely ablated regions of the front electrode layer (protrusions) in the region of the third patterning trench P3, but only there and not over the complete length of the third patterning trench P3. Through the combination of the two third patterning trenches P3, P3', only a slight reduction in the efficiency of the thin-film solar module results, which is, generally speaking, acceptable and enables the advantageous use of laser ablation for producing the two third patterning trenches P3, P3'.

If, in contrast to the method according to the invention, only one single third patterning trench per patterning zone were present, which had been produced with laser pulses of such great energy that the front electrode layer is reliably and safely completely removed, the creation of electrical short-circuit paths through converted material phases between the front electrode and the back electrode would be very likely. This would significantly reduce the efficiency of the thin-film solar module. If, on the other hand, only one single third patterning trench per patterning zone were present, which had been produced with laser pulses of such low energy that the creation of converted material phases is avoided, it is highly likely that continuous material bridges (webs) between the sections of the front electrode layer subdivided by the third patterning trench P3 would remain. These webs short-circuit the adjacent sections of the front electrode layer. This is also significantly reduces the efficiency of the thin-film solar module. Thus, if only one single third patterning trench per patterning zone is provided, which is produced by laser ablation, the conflict of objectives must be solved that, on the one hand, the energy of the laser pulse must not be too high in order to avoid an excessive change in the electrical properties of the absorber and, on the other, the energy of the laser pulse must not be too low to ensure complete ablation of the front electrode layer and to avoid leaving bridges between adjacent sections of the front electrode layer. As the inventors have ascertained, this conflict of objectives cannot be satisfactorily resolved in practice. The invention takes a completely novel approach through the combination of two third patterning trenches P3, P3' that were produced by laser pulses of different energy since the formation of a conversion region in the third patterning trench P3' has only minor effects on the electrical properties of the thin-film solar module.

The energy of the laser pulses for producing the two third patterning trenches P3, P3' is, for example, selected such that the trench depth within the absorber layer is in each case a maximum of 50% of the layer thickness of the absorber layer. For example, the layer thickness of the absorber layer is approx. 2 μm, with the two third patterning trenches P3, P3' having, for example, an average trench depth within the absorber layer of a maximum of 0.4 μm, in particular, a maximum of 0.1 μm.

Preferably, the energy of the laser pulses with lower energy for producing the third patterning trenches P3 is in the range from 5% to 70%, in particular in the range from 5% to 50%, in particular in the range from 5% to 30%, of the energy of the laser pulses with greater energy for producing the third patterning trenches P3'. With this, an adequate difference in terms of the above-described effects can be achieved. The energy of the laser pulses for producing the third patterning trenches P3' is advantageously in the range from 0.5 μJ to 20 μJ and is, for example, 3 μJ. Preferably, the pulse duration of the laser pulses is in the range from 1 femtosecond to 10 nanoseconds, in particular in the range from 1 picosecond to 100 picoseconds. The wavelength of the laser pulses is selected such that the front electrode layer can be passed through, with the wavelength advantageously being in the range from 400 nanometers to 1500 nanometers.

The third patterning trench P3' produced with laser pulses of greater energy is situated, for example, between the other third patterning trench P3 and the second patterning trench P2 of the same patterning zone. By means of this measure, an undesirable short-circuit path between the front electrode and the back electrode in the optically active region of the solar cell can be reliably and safely avoided.

As already stated, in accordance with one embodiment of the method according to the invention, the two third patterning trenches P3, P3' of one and the same patterning zone are produced without distance between them, in other words, the two third patterning trenches are directly adjacent one another. Alternatively, it is also possible for them to be spatially separated from one another by a section of the front electrode layer. This measure enables, in particular, a larger conversion region of the third patterning trench P3'.

The invention also extends to a thin-film solar module produced by the method according to the invention.

As already stated, the thin-film solar module according to the invention comprises a flat (planar) substrate with a layer structure applied thereon, comprising a back electrode layer, a front electrode layer, and an absorber layer arranged between the back electrode layer and the front electrode layer. In the layer structure, serially connected solar cells are formed by patterning zones. The patterning zones have in each case a first patterning trench P1 subdividing at least the back electrode layer, a second patterning trench P2 subdividing at least the absorber layer, as well as two third patterning trenches P3, P3' arranged near one another for subdividing at least the front electrode layer. The third patterning trenches P3, P3' produced by laser ablation do not completely subdivide the absorber layer. In particular, the third patterning trench P3' is arranged between the other third patterning trench P3 and the second patterning trench P2 of the same patterning zone 9. The two third patterning trenches P3, P3' can be arranged without space between them. Alternatively, they can be spatially separated from one another by a section of the front electrode layer.

Typically, in the thin-film solar module according to the invention, a buffer layer is arranged between the absorber layer and the front electrode layer. Preferably, the material of the buffer layer includes one or a plurality of compounds that are selected from the group consisting of indium sulfide (InS), sodium-doped indium sulfide (InS:Na), cadmium sulfide (CdS), zinc oxosulfide (ZnOS), and intrinsic zinc oxide (i-ZnO). In particular, the buffer layer can consist of one or a plurality of these materials.

According to the invention, one patterning trench P3 has at least one protrusion of the front electrode layer which extends, starting from the trench wall of the third patterning trench P3 facing the third patterning trench P3', over at least 25% of the width of the third patterning trench P3, but not all the way to the trench wall of the third patterning trench P3' of the same patterning zone opposite the protrusion. Any protrusions of the front electrode layer of the other third patterning trench P3' extend, starting from the trench wall of the third patterning trench P3' facing the third patterning trench P3, in each case over less than 25% of the width of the third patterning trench P3'.

The claimed structure of the thin-film solar module according to the invention, in particular of the at least one protrusion of the front electrode layer which extends, starting from the trench wall of the third patterning trench P3 facing the third patterning trench P3', over at least 25% of the width of the third patterning trench P3, can be detected and verified in a simple manner light-microscopically. It is likewise possible to verify a conversion region of the absorber layer by means of an analytical measurement method familiar to the person skilled in the art for determining the composition of the material of the absorber layer (e.g., by XPS-spectroscopy or Raman spectroscopy).

The various embodiments of the invention can be realized individually or in any combinations. In particular, the features mentioned above and hereinafter can be used not only in the combinations indicated but also in other combinations or in isolation without departing from the scope of the present invention.

The invention is now explained in detail using exemplary embodiments, referring to the accompanying figures. They depict, in simplified, not to scale representation.

DETAILED DESCRIPTION OF THE DRAWINGS

Figure 1:
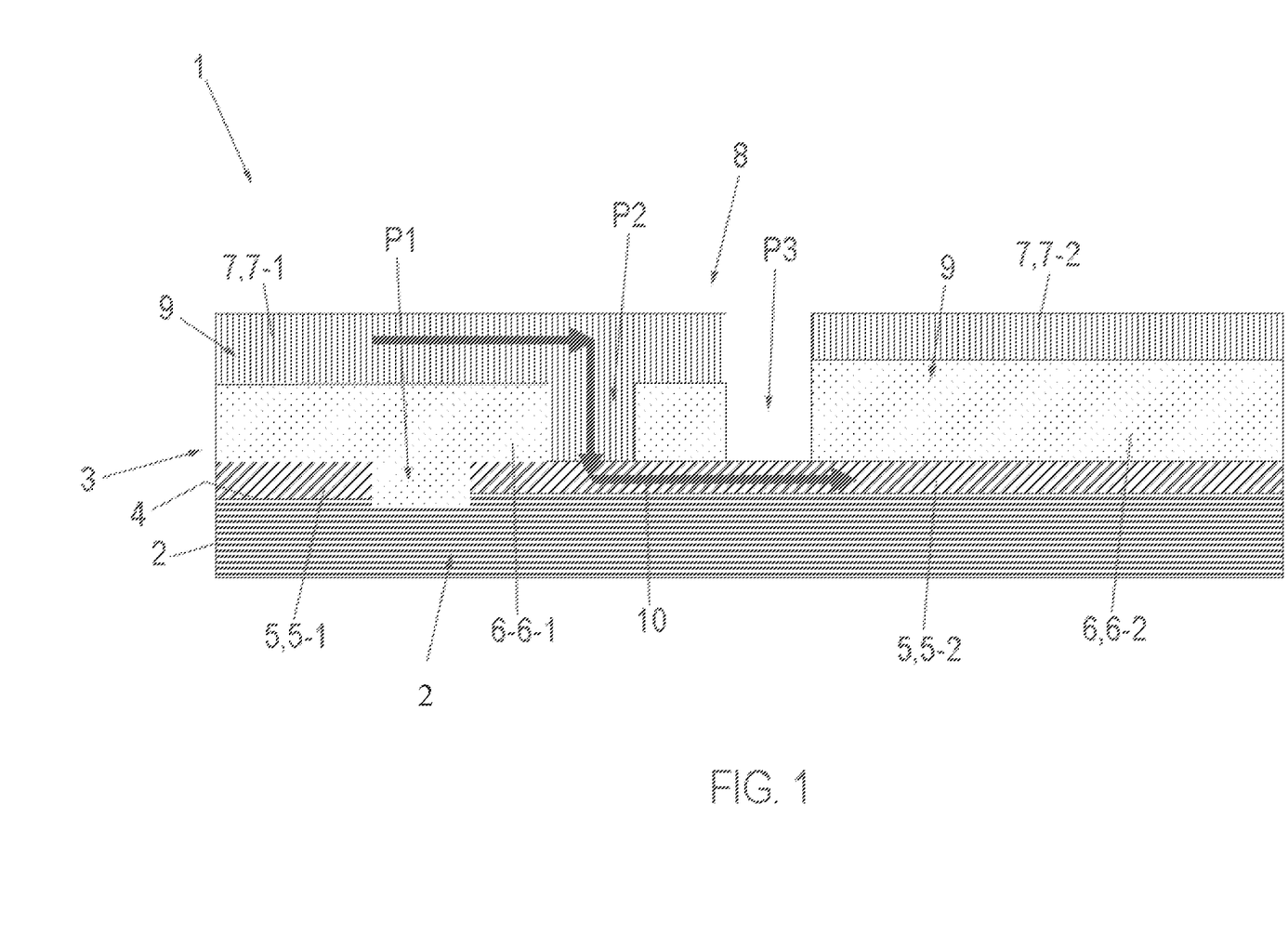
FIG. 1 a schematic representation of the integrated serial connection of solar cells of a prior art thin-film solar module.

FIG. 1 schematically illustrates a prior art thin-film solar module referenced as a whole with the number 1 in a cross-sectional view. The thin-film solar module 1 comprises a plurality of solar cells 9 serially connected to one another in integrated form, wherein, in a greatly simplified manner, only two solar cells 9 with identical structure are depicted. Of course, generally speaking, in the thin-film solar module 1, a large number of solar cells 9 (for example, approx. 100-150) are serially connected.

The thin-film solar module 1 has here, for example, a substrate configuration, in other words, it has a substrate 2 with a layer structure 3 made of thin films applied thereon, wherein the layer structure 3 is arranged on a light-entry-side (planar) substrate surface 4 of the substrate 2. The substrate 2 is implemented, for example, as a rigid glass plate, whereas other electrically insulating materials with desired stability and inert behavior relative to the process steps performed can equally be used.

The layer structure 3 includes, arranged on the substrate surface 4, an opaque back electrode layer 5, which is made, for example, from a light-impermeable metal such as molybdenum (Mo) and was applied on the substrate 2 by vapor deposition or magnetron-enhanced cathodic sputtering (sputtering). The back electrode layer 5 has, for example, a layer thickness in the range from 300 nm to 600 nm.

A photovoltaically active absorber layer 6 that is made of a semiconductor doped with metal ions whose band gap is capable of absorbing the greatest possible share of sunlight is situated above the back electrode layer 5. The absorber layer 6 is made here, for example, of a (e.g., p-conductive) chalcopyrite compound semiconductor, for example, a compound of the group $Cu(In,Ga)(S,Se)_2$, in particular sodium (Na)-doped $Cu(In,Ga)(S,Se)_2$. In the above formula, indium (In) and gallium (Ga) can be present alternatively or in combination. The same is true for sulfur (S) and selenium (Se), which can be present alternatively or in combination. The absorber layer 6 has a layer thickness that is, for example, in the range from 1 to 5 μm and is, in particular, approx. 2 μm. For the production of the absorber layer 6, various material layers are applied, for example, by sputtering, which layers are subsequently thermally converted to form the compound semiconductor by heating in a furnace (RTP=rapid thermal processing), typically, in an atmosphere containing S and/or Se. This manner of production of a compound semiconductor is well known to the person skilled in the art such that it need not be discussed in detail here.

Typically deposited on the absorber layer 6 is a buffer layer, which consists here, for example, of a single layer of sodium-doped indium sulfide ($In_2S_3$:Na) and a single layer of (non-doped) intrinsic zinc oxide (i-ZnO), not depicted in FIG. 1.

A front electrode layer 7 is applied over the absorber layer 6, for example, by sputtering. The front electrode layer 7 is transparent to radiation in the visible spectral range ("window electrode") such that the incoming sunlight is weakened only slightly. The front electrode layer 7 is based, for example, on a doped metal oxide, for example, n-conducting aluminum (Al)-doped zinc oxide (ZnO). Such a front electrode layer 7 is generally referred to as a TCO layer (TCO=transparent conductive oxide). The layer thickness of the front electrode layer 7 is, for example approx. 500 nm.

The layer structure 3 has various patterning trenches, by means of which the integrated serially connected solar cells 9 are formed. The patterning is done using suitable patterning technology. Thus, the back electrode layer 5 is subdivided by first patterning trenches P1 into back electrode layer sections completely separated from one another, which sections form the back electrodes 5-1, 5-2 of the solar cells 9. The absorber layer 6 is subdivided by second patterning trenches P2 into the absorber layer sections completely separated from one another, which sections form in each case the photovoltaically active regions or absorbers 6-1, 6-2 of the solar cells 9. The front electrode layer 7 is subdivided by third patterning trenches P3 into front electrode layer sections completely separated from one another, which form in each case the front electrodes 7-1, 7-2 of the solar cells 9. Each direct succession of a first, second, and third patterning trench P1-P2-P3 forms a patterning zone 8, wherein an individual solar cell 9 is delimited by two directly adjacent patterning zones 8.

The third patterning trenches P3 extend here, for example, all the way to the back electrode layer 5, with the only requirement being to subdivide the front electrode layer 7. The third patterning trenches P3 are produced conventionally mechanically by scraping off the front electrode layer 7 and the absorber layer 6 using a needle (needle scribing).

The patterning trenches P1, P2, P3 are in each case filled by material. The first patterning trench P1 is filled by material of the absorber layer 6. The second patterning trench P2 is filled by material of the front electrode layer 7 such that the front electrode 7-1 of one solar cell 9 is electrically conductively connected to the back electrode 5-2 of the adjacent solar cell 9, with the front electrode 7-1 directly contacting the back electrode 5-2 through the material in the second patterning trench. By this means the solar cells 9 are serially connected in an integrated form. The third patterning trench P3 is filled by the material of an adhesive layer that serves to connect the coated substrate 2 to a cover layer (e.g., glass plate) for protection against environmental influences. This is not depicted in FIG. 1 and is without relevance for the understanding of the invention.

In a known manner, electron-hole pairs are generated in the photovoltaically active absorbers 6-1, 6-2 of the solar cells 9 by solar irradiation. A resulting current path 10 for the electrical current (electrons) from one solar cell 9 to the adjacent solar cell 9 is illustrated schematically in FIG. 1.

Figure 2:
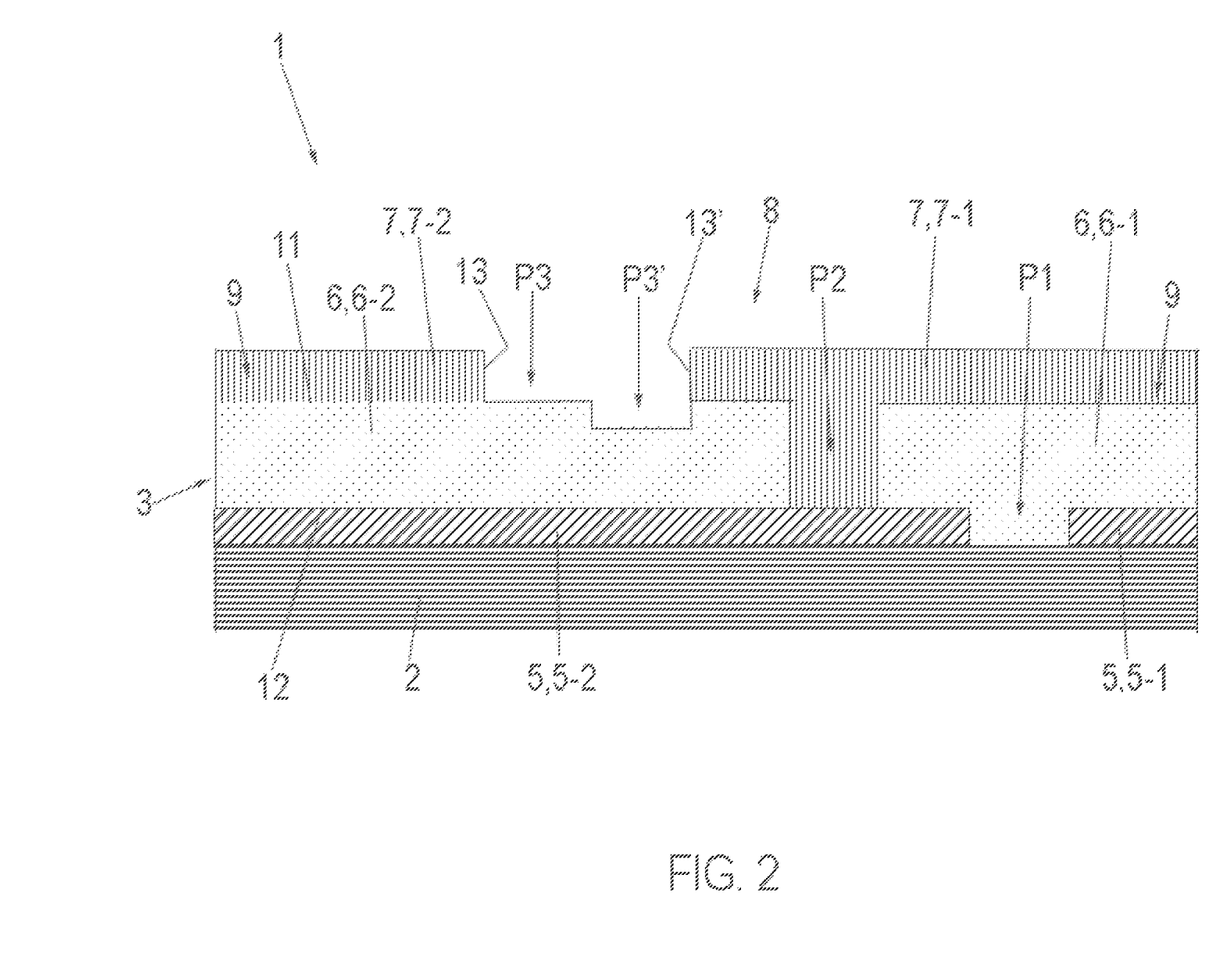
FIG. 2 a schematic representation of the integrated serial connection of solar cells according to an embodiment of the thin-film solar module according to the invention.

Reference is now made to FIG. 2, wherein an embodiment of the thin-film solar module 1 according to the invention is illustrated. In order to avoid unnecessary repetitions, only the differences relative to the thin-film solar module 1 of FIG. 1 are explained and, otherwise, reference is made to the statements made there.

In contrast to FIG. 1, in FIG. 2, the order of the patterning trenches P1, P2, P3 is reversed, corresponding to a laterally reversed viewing direction of the cross-sectional view. The structure differs only in a different design in the region of the third patterning trench P3, wherein for one and the same patterning zone 8, instead of a single third patterning trench P3, two third patterning trenches, labeled in FIG. 2 as P3 and P3', are provided. The two third patterning trenches P3, P3' are produced not by needle scribing, but, instead, by laser ablation in each case, wherein the third patterning trench P3' was produced by laser pulses that had greater energy than that for producing the patterning trench P3. Accordingly, the third patterning trench P3' can have a greater depth in the center than the third patterning trench P3, as is illustrated merely schematically in FIG. 2. It is essential that the energy of the laser pulses for producing the two patterning trenches P3, P3' was different from one another and the patterning trench P3' was produced with laser pulses of greater energy than the patterning trench P3.

The two patterning trenches P3, P3' do not, in each case, completely subdivide the absorber layer 6 and, thus, do not extend all the way to a substrate-side interface 12 of the absorber layer 6. For example, the bottoms of the trenches of the two third patterning trenches P3, P3' are situated near a front-electrode-side interface 11 of the absorber layer 6.

Laser pulses with energies different from one another were used for producing the two third patterning trenches P3, P3', with the energy of the laser pulses with lower energy for producing the third patterning trenches P3, for example, being 5% to 30% of the energy of the laser pulses with greater energy for producing the third patterning trenches P3'. The energy of the laser pulses for producing the third patterning trenches P3' was, for example, in the range from 0.5 μJ to 20 μJ. The pulse duration of the laser pulses was, for example, in the range from 1 femtosecond to 10 nanoseconds. The wavelength of the laser pulses was in the range from 400 nm to 1500 nm such that the directly irradiated front electrode layer 7 could be passed through by the laser pulses and the energy of the laser pulses for ablation of the front electrode layer 7 could be absorbed by the absorber layer 6.

In the embodiment of FIG. 2, the two third patterning trenches P3, P3' are arranged directly adjacent with no distance between them. Accordingly, the one third patterning trench P3 is delimited by a trench wall 13 formed by the front electrode 7-2. The trench wall 13 faces the other third patterning trench P3'. Correspondingly, the other third patterning trench P3' is delimited by a trench wall 13' formed by the front electrode 7-1. The trench wall 13' faces the other third patterning trench P3 as well as the other trench wall 13. The two trench walls 13, 13' are positioned opposite one another and, together, delimit the two third patterning trenches P3, P3'.

Figure 3:
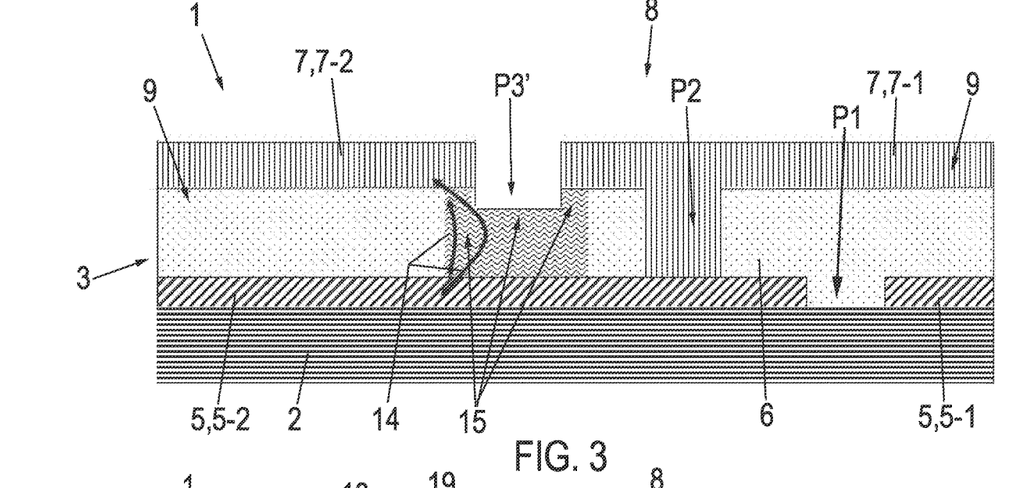
FIG. 3 a schematic representation of the integrated serial connection of solar cells of a thin-film solar module that is not part of the invention with a single P3 line per patterning zone.

The advantageous effect achieved through the invention is now explained in greater detail with reference to FIGS. 3 and 4. FIG. 3 depicts a schematic representation of the integrated serial connection of solar cells of a thin-film solar module 1 in a cross-sectional view. The inventive idea is not realized in this thin-film solar module 1. In contrast to the invention, the patterning zones 8 have in each case only a single third patterning trench P3'. The patterning trench P3' was produced by laser ablation with laser pulses of comparatively high energy, whose energy was selected such that the front electrode layer 7 was reliably and safely removed. Due to the typically Gaussian-distribution-like energy profile of the laser pulses, laser energy is introduced in a non-vaporized conversion region 15 of the absorber layer 6 adjacent the third patterning trench P3', which energy does not result in vaporization of the material of the absorber layer 6, but in a change in the material and, thus, in a change of the electrical properties of the absorber layer 6. The conversion region 15 of the absorber layer 6 is schematically identified in FIG. 3 by darker hatching. Without being bound to any theory, the inventors currently assume that in the conversion region 15 in the case of ternary chalcopyrite compound semiconductors increasingly binary material phases are produced, which typically have greater electrical conductivity than the chalcopyrite compound semiconductor itself. These regions with increased electrical conductivity undesirably result in electrical short-circuit paths (shunts) 14 between the front electrode 7-2 and the back electrode 5-2 of the solar cell 9, which are sketched in by way of example in FIG. 3. Due to the substantially greater distance between the two front electrodes 7-1, 7-2 of the adjacent solar cells 9, not apparent from the schematic presentation of FIG. 3, a possible electrical short-circuit path between the two front electrodes 7-1, 7-2 is not relevant. It is essential here that the short-circuit current paths 14 (perpendicular to the plane of the drawing) extend over the complete length of the third patterning trench P3' such that the efficiency of the thin-film solar module 1 is significantly reduced. For this reason, use of laser ablation for producing patterning zones 8 that have in each case only a single third patterning trench P3' must be ruled out by the informed person skilled in the art.

According to the invention, the problem described in connection with FIG. 3 can be avoided, as is clarified in the following with reference to FIG. 4, wherein another embodiment of the thin-film solar modules 1 according to the invention is depicted in a schematic cross-sectional view. The thin-film solar module 1 of FIG. 4 differs from the thin-film solar module 1 of FIG. 2 only in that the two third patterning trenches P3, P3' are not adjacent one another without distance between them, but, instead, a narrow front electrode layer section 16 of the front electrode layer 7 is situated between the two third patterning trenches P3, P3'. Accordingly, one third patterning trench P3 is delimited by the (first) trench wall 13 formed by the front electrode 7-2, which faces the other third patterning trench P3', and a (second) trench wall 19 formed by the front electrode layer section 16, which faces away from the other third patterning trench P3'. The first trench wall 13 and the second trench wall 19 are positioned opposite one another. Correspondingly, the other third patterning trench P3' is delimited by the (first) trench wall 13' formed by the front electrode 7-1, which faces the other third patterning trench P3, and a (second) trench wall 19' formed by the front electrode layer section 16, which faces away from the other third patterning trench P3. The first trench wall 13' and the second trench wall 19' are positioned opposite one another.

According to the embodiment of FIG. 2, the third patterning trench P3' was produced with laser pulses of greater energy than the third patterning trench P3. As illustrated in FIG. 4, the third patterning trench P3' can have a greater depth in the center than the third patterning trench P3. As explained in connection with FIG. 3, a conversion of the absorber layer 6 is quite likely in a conversion region 15 bordering the third patterning trench P3', in which no vaporization of the absorber layer 6 occurs. The conversion region 15 is schematically identified using darker hatching. The energy of the laser pulses with greater energy was selected such that the front electrode layer 7 was substantially completely removed in the region of the third patterning trench P3' such that in any case no protrusion remains that has, starting from the (first) trench wall 13', a dimension of at least 25% of the width of the third patterning trench P3'. The conversion region 15 extends all the way to the directly adjacent third patterning trench P3, but not all the way to the trench wall 13 of the third patterning trench P3 facing the third patterning trench P3'. These statements apply analogously for the embodiment according to the invention of FIG. 2.

In contrast to this, the energy of the laser pulses with lower energy was selected such that substantially no conversion of the absorber layer 6 is caused in the edge region of the third patterning trench P'and thus no conversion region 15 is produced. However, this results in the fact that the front electrode layer 7 is not completely removed and one or a plurality of protrusions of the front electrode layer 7 in the direction of the other patterning trench P3' are produced. Specifically, the energy of the laser pulses with lower energy was selected such that during the production of the third patterning trench, at least one protrusion of the front electrode layer 7 remains that has, starting from the (first) trench wall 13, a dimension of at least 25%, in particular at least 50%, in particular at least 75%, in particular at least 100%, of the width of the third patterning trench P3. In the embodiment of FIG. 4, such a protrusion can extend, for example, from the (first) trench wall 13 all the way to the front electrode layer section 16 or beyond. In the embodiment of FIG. 2, such a protrusion can, for example, extend from the (first) trench wall 13 all the way to the other third patterning trench P3' and in particular extend into it. However, regardless of the specific embodiment, such a protrusion does not extend all the way to the (first) trench wall 13' of the other third patterning trench P3' and has, in particular, a distance from the (first) trench wall 13' of the other third patterning trench P3' that corresponds to at least 25% of the width of the third patterning trench P3'. Such a protrusion is explained in detail in connection with FIGS. 5A and 5B.

Figure 4:
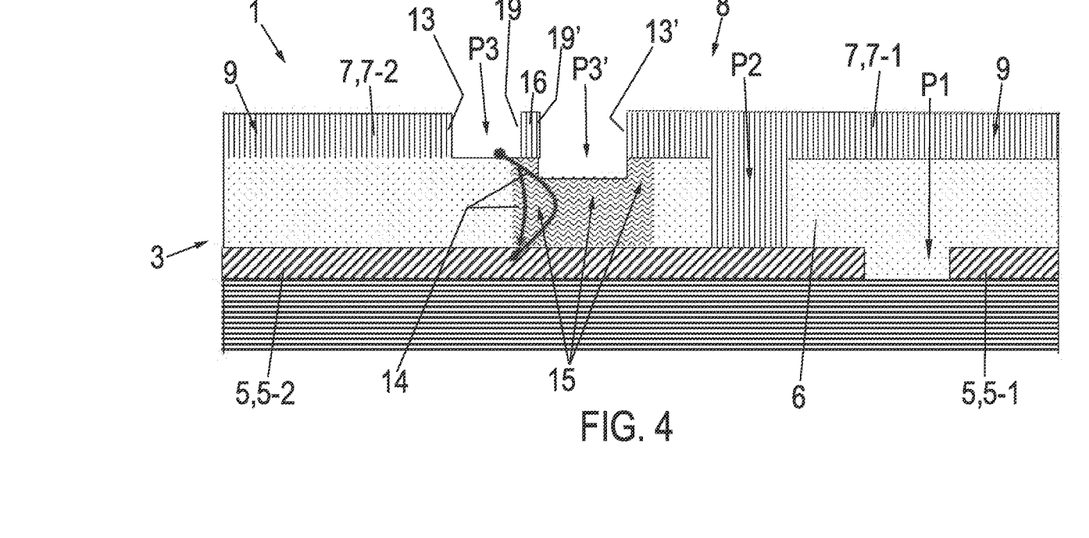
FIG. 4 a schematic representation of the integrated serial connection of solar cells according to another embodiment of the thin-film solar module according to the invention.

Additionally, in FIG. 4 the short-circuit current paths (shunts) 14 between the front electrode 7-2 and the back electrode 5-2 of the solar cell 9 due to the electrically better conducting conversion regions 15 are depicted schematically. The short-circuit current paths 14 do not extend all the way to the edge of the front electrode 7-2 or the (first) trench wall 13, since the conversion region 15 does not reach that far due to the third patterning trench P3. For this reason, due to protrusions of the front electrode layer 7 in the region of the third patterning trench P3, only a very small (generally negligible) short-circuit current can flow between the front electrode 7-2 and the back electrode 5-2 of the solar cell 9. This advantageous effect occurs with both embodiments of the thin-film solar cell module 1 according to the invention of FIG. 2 and FIG. 4.

Figure 5A:
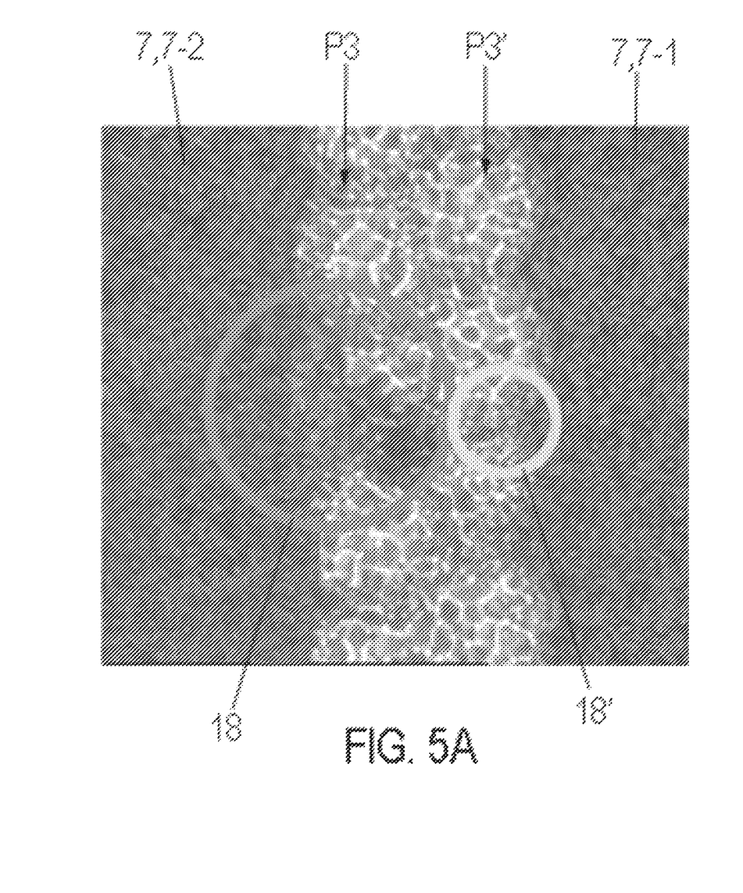
FIG. 5A a light microscopic image of the two P3 lines of a thin-film solar module according to the invention in accordance with the embodiment of FIG. 2.
Figure 5B:
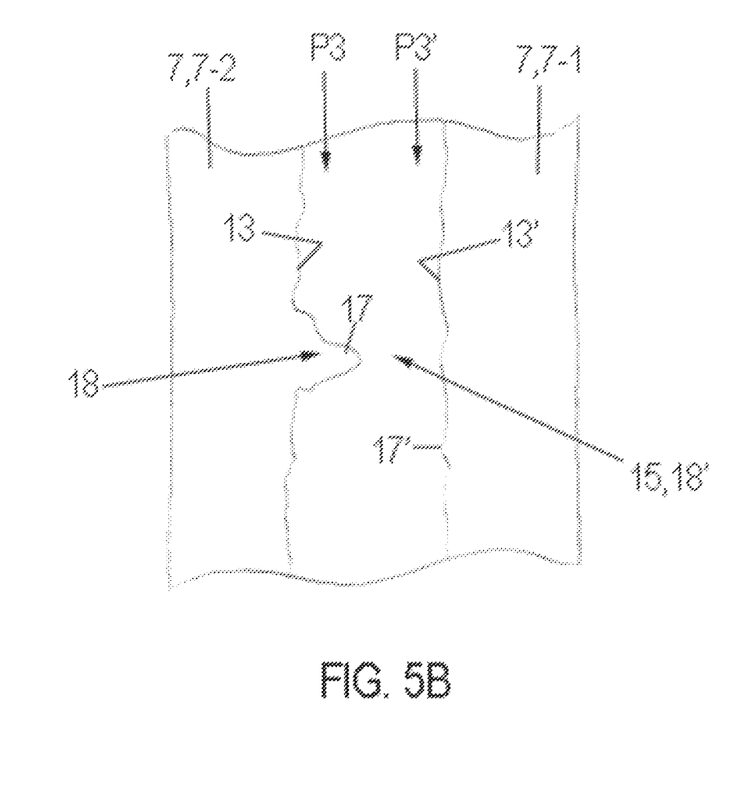
FIG. 5B a schematic sketch of the two P3 lines of FIG. 5A.

Reference is now made to FIGS. 5A and 5B. FIG. 5A depicts a light microscopic image of two directly adjacent third patterning trenches P3, P3' according to the embodiment of of FIG. 2. FIG. 5B schematically reproduces the light microscopic image of FIG. 5A as a sketch. In both figures, a protrusion 17 of the front electrode 7-2 is discernible, corresponding to non-ablated material of the front electrode layer 7. The protrusion 17 extends from the (first) trench wall 13 of the third patterning trench P3 in the direction of the (first) trench wall 13' of the third patterning trench P3', with the dimension of the protrusion corresponding roughly to the width of the third patterning trench P3. The two trench walls 13, 13' have a certain unevenness or waviness. The (micro-)protrusions formed by the unevenness of the trench walls 13, 13' typically have a respective dimension that is substantially less than 25% of the width of the associated third patterning trench P3, P3' and can thus be distinguished in a simple manner (for example, light microscopically) from the at least one protrusion 17 that extends over more than 25% of the width of the third patterning trench P3. In FIG. 5B, one (micro-)protrusion 17' of the trench wall 13' is sketched in by way of example.

In the depiction of FIGS. 5A and 5B, the protrusion 17 extends (within the scope of usual tolerances) all the way to the third patterning trench P3'. Such a configuration can be obtained when the third patterning trench P3' is produced temporally before or after the third patterning trench P3. By means of the combination according to the invention of the two third patterning trenches P3, P3', which are produced by laser pulses of different energy, it can be advantageously accomplished that the protrusion 17 of the front electrode 7-2 in the region of the third patterning trench P3 does not extend all the way to the opposite front electrode 7-1 but, instead, only to the third patterning trench P3' and thus makes electrical contact only with the conversion region 15. In this manner, it is accomplished that two spatially very small short-circuit regions 18, 18' (produced by the protrusion 17 and the conversion region 15) are present. Advantageously, the short-circuit current paths 14 thus do not extend over the complete length of the two third patterning trenches P3, P3', but spatially limited to the two short-circuit regions 18, 18'. The short-circuit current is, consequently, very small and the efficiency of the thin-film solar module 1 is only slightly reduced.

Figure 6:
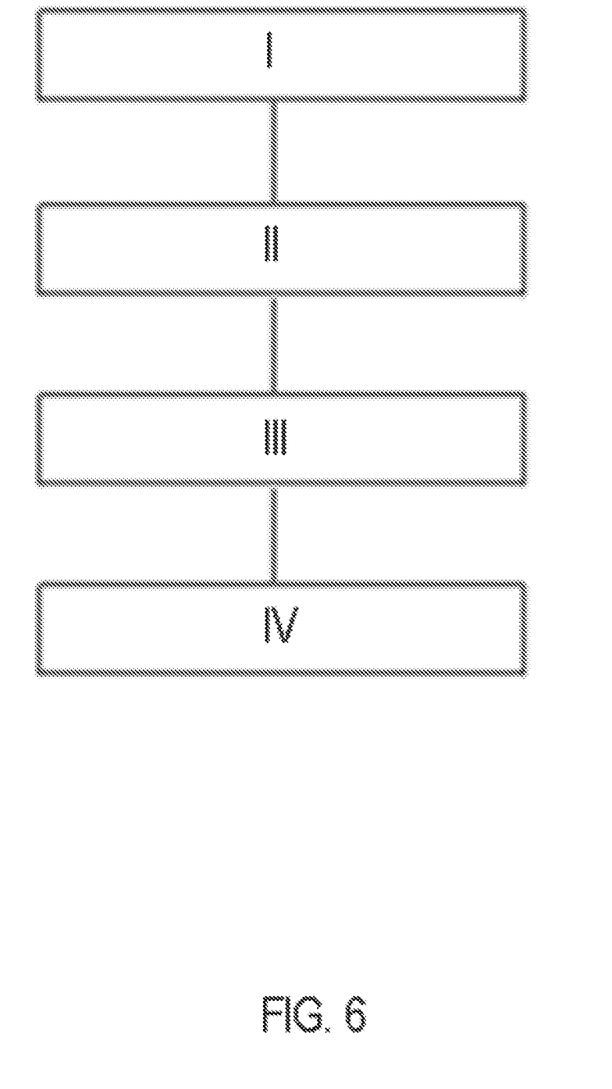
FIG. 6 a flowchart to illustrate the method according to the invention.

FIG. 6 illustrates, using a flowchart, an exemplary method for producing the above-described thin-film solar module 1 according to the invention. According to it, in a first step I, a flat substrate 2 is provided. In another step II, a back electrode layer 5, which is patterned for forming the back electrodes of the solar cells by first patterning trenches P1, is deposited on one side of the flat substrate 2. In another step III, an absorber layer 6, which is patterned for forming the photovoltaically active absorbers 6-1, 6-2 of the solar cells 9 by second patterning trenches P2, is deposited over the back electrode layer 5. In another step IV, a front electrode layer 7, which is patterned by third patterning trenches P3, P3' for forming the front electrodes 7-1, 7-2 of the solar cells 9, is deposited over the absorber layer 6. The third patterning trenches P3, P3' are produced by laser ablation. For each patterning zone 8, two third patterning trenches P3, P3' are produced, wherein a third patterning trench P3 of one and the same patterning zone 8 is produced with laser pulses that have greater energy than the laser pulses for producing the other third patterning trench P3 of the patterning zone 8.

The invention makes available a method for producing a thin-film solar module, as well as a corresponding thin-film solar module, in which, for each patterning zone, two adjacent third patterning trenches P3, P3' are produced by laser ablation by laser pulses of different energy. Short-circuit current paths do not extend over the complete length of the two third patterning trenches P3, P3' but, instead, are spatially limited to protrusions in the region of the third patterning trench P3 such that no decline in the efficiency of the thin-film solar module occurs. Instead of the needle scribing used in the prior art, which is associated with time and cost intensive maintenance, a pulsed laser beam can be used advantageously for producing the third patterning trenches of the patterning zones. The method according to the invention can be realized in a relatively simple manner in existing systems for producing thin-film solar modules.

LIST OF REFERENCE CHARACTERS

1 thin-film solar module
2 substrate
3 layer structure
4 substrate surface
5 back electrode layer
5-1, 5-2 back electrode
6 absorber layer
6-1, 6-2 absorber
7 front electrode layer
7-1, 7-2 front electrode
8 patterning zone
9 solar cell
10 current path
11 front-electrode-side interface
12 substrate-side interface
13, 13' (first) trench wall
14 short-circuit current path (shunt)
15 conversion region
16 front electrode layer section
17, 17' protrusion
18, 18' short-circuit region
19, 19' (second) trench wall

The invention claimed is:

1. A method for producing a thin-film solar module with serially connected solar cells, the method comprising:
providing a substrate, wherein the substrate is flat;
depositing a back electrode layer on one side of the substrate; subdividing at least the back electrode layer by first patterning trenches; depositing an absorber layer over the back electrode layer;
subdividing at least the absorber layer by second patterning trenches; depositing a front electrode layer over the absorber layer; and subdividing at least the front electrode layer by third patterning trenches,
wherein
a patterning zone is formed by a succession of a first patterning trench,
a second patterning trench, and two adjacent third patterning trenches,
the two adjacent third patterning trenches are formed by laser ablation with a pulsed laser beam, and
one third patterning trench of the two adjacent third patterning trenches of the patterning zone is formed with laser pulses of higher energy and the other third patterning trench of the two adjacent third patterning trenches of the patterning zone is formed with laser pulses of lower energy;

wherein the absorber layer is not completely subdivided by the two adjacent third patterning trenches, such that the two adjacent third patterning trenches each extend into the absorber layer but not all the way to a substrate-side interface of the absorber layer.

2. The method according to claim 1, wherein energy of the laser pulses of lower energy is selected such that at least one protrusion of the front electrode layer remains, the at least one protrusion extending, starting from a trench wall of the one third patterning trench facing the other third patterning trench, over at least 25% of the width of the one third patterning trench, but not all the way to a trench wall of the other third patterning trench of the same patterning zone opposite the at least one protrusion.

3. The method according to claim 2, wherein the energy of the laser pulses of lower energy is selected such that the at least one protrusion of the front electrode layer extends over an amount selected from the group consisting of: at least 50%, at least 75%, and at least 100% of the width of the one third patterning trench.

4. The method according to claim 1, wherein energy of the laser pulses of higher energy is selected such that no protrusion of the front electrode layer extending, starting from a trench wall of the other third patterning trench facing the one third patterning trench, over at least 25% of the width of the other third patterning trench, remain.

5. The method according to claim 4, wherein the energy of the laser pulses of higher energy is selected such that all protrusions of the front electrode layer extend over a maximum amount selected from the group consisting of: 10%, 5%, and 1% of the width of the other third patterning trench.

6. The method according to claim 1, wherein the two adjacent third patterning trenches are directly adjacent to each other.

7. The method according to claim 1, wherein a front electrode layer section is located between the two adjacent third patterning trenches.

8. The method according to claim 1, wherein energy of the laser pulses of lower energy is selected from a group of ranges consisting of: from 5% to 70%, from 5% to 50%, and from 5% to 30%, of energy of the laser pulses of higher energy.

9. The method according to claim 1, wherein the laser pulses of higher energy have energy in a range from 0.5 µJ to 20 µJ.

10. The method according to claim 1, wherein the laser pulses have a pulse duration in a range from 1 femtosecond to 10 nanoseconds or from 1 picosecond to 100 picoseconds.

11. The method according to claim 1, wherein the laser pulses have a wavelength in a range from 400 nanometers to 1500 nanometers.

12. The method according to claim 1 wherein the two adjacent third patterning trenches are produced by partial overlapping of individual laser pulses.

13. A thin-film solar module produced by the method of claim 1, comprising the substrate and a layer structure applied thereon, the layer structure comprising the back electrode layer, the front electrode layer, and the absorber layer arranged between the back electrode layer and the front electrode layer, the layer structure comprising the serially connected solar cells formed by patterning zones, wherein at least one patterning zone has:

the first patterning trench subdividing at least the back electrode layer, the second patterning trench subdividing at least the absorber layer, and the two third patterning trenches adjacent to each other, subdividing the front electrode layer, wherein the one third patterning trench of the third patterning trenches has at least one protrusion of the front electrode layer extending, starting from a trench wall of the one third patterning trench facing the other third patterning trench, over at least 25% of a width of the one third patterning trench, but not all the way to a trench wall of the other third patterning trench of the same patterning zone opposite the at least one protrusion, and the other third patterning trench of the two pattering trenches has no protrusions of the front electrode layer extending, starting from the trench wall of the other third patterning trench facing the one third patterning trench, over at least 25% of a width of the other third patterning trench.

14. The thin-film solar module according to claim 13, wherein the two third patterning trenches are directly adjacent to each other.

15. The thin-film solar module according to claim 13, wherein a front electrode layer section is arranged between the two third patterning trenches.

16. The method according to claim 12, wherein the patterning zone is linear or rectilinear.

* * * * *